United States Patent
Agrawal et al.

(10) Patent No.: US 10,452,744 B2
(45) Date of Patent: Oct. 22, 2019

(54) MEMORY MANAGEMENT FOR SPARSE MATRIX MULTIPLICATION

(71) Applicant: Oracle International Corporation, Redwood Shores, CA (US)

(72) Inventors: Sandeep R. Agrawal, San Jose, CA (US); Sam Idicula, Santa Clara, CA (US); Nipun Agarwal, Saratoga, CA (US)

(73) Assignee: Oracle International Corporation, Redwood Shores, CA (US)

( * ) Notice: Subject to any disclaimer, the term of this patent is extended or adjusted under 35 U.S.C. 154(b) by 107 days.

(21) Appl. No.: 15/470,377

(22) Filed: Mar. 27, 2017

(65) Prior Publication Data
US 2018/0275909 A1 Sep. 27, 2018

(51) Int. Cl.
  *G06F 3/06* (2006.01)
  *G06F 17/16* (2006.01)
  *G06N 3/08* (2006.01)

(52) U.S. Cl.
  CPC ............. *G06F 17/16* (2013.01); *G06N 3/08* (2013.01)

(58) Field of Classification Search
  CPC .... G06F 3/0647; G06F 3/0608; G06F 3/0611; G06F 3/0661; G06F 3/0685; G06F 17/16
  See application file for complete search history.

(56) References Cited

U.S. PATENT DOCUMENTS

| | | | |
|---|---|---|---|
| 2013/0073599 A1* | 3/2013 | Maloney | G06F 9/3001 708/514 |
| 2015/0248584 A1* | 9/2015 | Greveson | G06K 9/00476 382/113 |
| 2017/0168990 A1* | 6/2017 | Kernert | G06F 17/16 |
| 2017/0193361 A1* | 7/2017 | Chilimbi | G06N 3/08 |
| 2018/0275909 A1* | 9/2018 | Agrawal | G06F 3/0647 |

OTHER PUBLICATIONS

Richard W. Vuduc and Hyun-Jin Moon. Fast sparse matrix-vector multiplication by exploiting variable block structure. In Proceedings of the First international conference on High Performance Computing and Communications (HPCC'05). (Year: 2005).*
Steven Dalton, Luke Olson, and Nathan Bell. 2015. Optimizing Sparse Matrix-Matrix Multiplication for the GPU. ACM Trans. Math. Softw. 41, 4, Article 25 (Oct. 2015), 20 pages.

(Continued)

*Primary Examiner* — Ramon A. Mercado
(74) *Attorney, Agent, or Firm* — Hickman Palermo Becker Bingham LLP

(57) ABSTRACT

Techniques related to memory management for sparse matrix multiplication are disclosed. Computing device(s) may perform a method for multiplying a row of a first sparse matrix with a second sparse matrix to generate a product matrix row. A compressed representation of the second sparse matrix is stored in main memory. The compressed representation comprises a values array that stores non-zero value(s). Tile(s) corresponding to row(s) of second sparse matrix are loaded into scratchpad memory. The tile(s) comprise set(s) of non-zero value(s) of the values array. A particular partition of an uncompressed representation of the product matrix row is generated in the scratchpad memory. The particular partition corresponds to a partition of the second sparse matrix comprising non-zero value(s) included (Continued)

in the tile(s). When a particular tile is determined to comprise non-zero value(s) that are required to generate the particular partition, the particular tile is loaded into the scratchpad memory.

20 Claims, 9 Drawing Sheets

(56) References Cited

OTHER PUBLICATIONS

Patwary, Md Mostofa Ali, et al. "Parallel efficient sparse matrix-matrix muiltiplication on multicore platforms." International Conference on High Performance Computing , dated 2015, 11 pages.
Liu et al., "An Efficient GPU General Sparse Matrix-Matrix Multiplication for Irregular Data," Parallel and Distributed Processing Symposium, 2014 IEEE 28th International, pp. 370-381.
Im, Eun-Jin et al. "Optimizing the performance of sparse matrix-vector multiplication", University of California, Berkeley, 2000, 132 pages.
Dalton et al., 2015. Optimizing Sparse Matrix Operations on GPUs Using Merge Path. In Proceedings of the 2015 IEEE International Parallel and Distributed Processing IEEE Computer Society, pp. 407-416.
Agrawal et al., "2016. Exploiting accelerators for efficient high dimensional similarity search",In Proceedings of the 21st ACM SIGPLAN Symposium Principles and Practice of Parallel Programming, 12pgs.

\* cited by examiner

FIG. 1

UNCOMPRESSED REPRESENTATIONS 100

| 5 | 0 | 6 | 0 | 6 | 0 | 0 | 7 |
| 0 | 0 | 1 | 5 | 9 | 0 | 2 | 0 | 0 |
| 4 | 0 | 0 | 0 | 5 | 0 | 0 | 0 |
| 3 | 9 | 4 | 0 | 4 | 1 | 0 | 0 |
| 0 | 0 | 0 | 0 | 0 | 9 | 5 | 0 |
| 0 | 8 | 0 | 0 | 3 | 8 | 0 | 6 |
| 0 | 0 | 3 | 0 | 0 | 0 | 0 | 0 |
| 2 | 7 | 2 | 0 | 2 | 0 | 4 | 0 |
| 1 | 0 | 0 | 8 | 0 | 0 | 3 | 0 |
| 0 | 6 | 0 | 7 | 1 | 7 | 0 | 0 |

SECOND SPARSE MATRIX 104

FIRST SPARSE MATRIX 102: [0, 0, 1, 2, 0, 0, 0, 3]

PRODUCT MATRIX 106: [14, 16, 2, 3, 18, 0, 4, 0, 23, 27]

FIG. 2

COMPRESSED REPRESENTATION 200

ROWS ARRAY 202: 0, 5, 10, 15, 18, 24, 29, 32, 34

VALUES ARRAY 204: 1, 2, 3, 4, 5, 6, 7, 8, 9, 1, 2, 3, 4, 5, 6, 7, 8, 9, 1, ...

COLUMNS ARRAY 206: 1, 2, 6, 7, 9, 0, 2, 4, 6, 8, 2, 3, 6, 8, 9, 0, 1, 8, 0, ...

MEMORY MANAGEMENT FOR SPARSE MATRIX MULTIPLICATION

TECHNICAL FIELD

Embodiments generally relate to large-scale data management and analysis. More specifically, embodiments relate to memory management for sparse matrix multiplication.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

A sparse matrix is a matrix in which a vast majority of the elements has a value of zero. Sparse matrices are widely used in many practical applications across various industries. For example, text processing generates sparse matrices, and computing document similarity involves sparse matrix multiplication. Additionally, sparse matrix multiplication plays a significant role in computer graphics. Furthermore, many graph problems, such as breadth-first searches and algebraic multigrid methods, involve sparse matrices.

Sparse matrix multiplication can be computationally intensive, especially when it involves matrices with a large number of elements. For the sake of clarity and ease of explanation, however, techniques for efficiently multiplying sparse matrices are described herein with reference to the toy example of FIG. 1.

Multiplying Uncompressed Sparse Matrices

FIG. 1 depicts uncompressed representations 100 of first sparse matrix 102, second sparse matrix 104, and product matrix 106. Although depicted in FIG. 1 as having only one row, in some embodiments, first sparse matrix 102 and product matrix 106 may each have multiple rows. In such embodiments, however, first sparse matrix 102 and product matrix 106 will have the same number of rows, and a particular row of first sparse matrix 102 will be used to generate a corresponding row of product matrix 106. For example, the first row of first sparse matrix 102 may be multiplied with each column of second sparse matrix 104 to generate the first row of product matrix 106. As used herein, "generating" all or part of product matrix 106 involves computing, accumulating, and/or storing all or part of product matrix 106.

When multiplying sparse matrices, however, computational resources may be conserved by avoiding multiplication operations with elements having a value of zero. This is based on the observation that the nth element of first sparse matrix 102 is multiplied to the nth element of each column of second sparse matrix 104.

For example, matrix multiplication typically involves generating the first element of product matrix 106 based on multiplying first sparse matrix 102 with the first column of second sparse matrix 104 as follows: $(0 \times 0)+(0 \times 6)+(1 \times 0)+(2 \times 7)+(0 \times 1)+(0 \times 7)+(0 \times 0)+(3 \times 0)=14$. Additionally, the second element of product matrix 106 is typically generated based on multiplying first sparse matrix 102 with the second column of second sparse matrix 104 as follows: $(0 \times 1)+(0 \times 0)+(1 \times 0)+(2 \times 8)+(0 \times 0)+(0 \times 0)+(0 \times 3)+(3 \times 0)=16$. Furthermore, the third element of product matrix 106 is typically generated based on multiplying first sparse matrix 102 with the third column of second sparse matrix 104 as follows: $(0 \times 2)+(0 \times 7)+(1 \times 2)+(2 \times 0)+(0 \times 2)+(0 \times 0)+(0 \times 4)+(3 \times 0)=2$. And so forth.

In the equations above, an element of product matrix 106 is generated based on computing a total sum of the partial sums indicated in parentheses. Notably, the first partial sum of each equation corresponds to the first element of first sparse matrix 102 multiplied with the first element of a respective column of second sparse matrix 104, the second partial sum of each equation corresponds to the second element of first sparse matrix 102 multiplied with the second element of a respective column of second sparse matrix 104, the third partial sum of each equation corresponds to the third element of first sparse matrix 102 multiplied with the third element of a respective column of second sparse matrix 104, and so forth. This pattern indicates that product matrix 106 may alternatively be generated based on accumulating rows of partial sums. Example rows of partial sums are provided below.

| Partial Sums Row 1 | | | | | | | | | |
|---|---|---|---|---|---|---|---|---|---|
| 0 | 0 | 0 | 0 | 0 | 0 | 0 | 0 | 0 | 0 |

| Partial Sums Row 2 | | | | | | | | | |
|---|---|---|---|---|---|---|---|---|---|
| 0 | 0 | 0 | 0 | 0 | 0 | 0 | 0 | 0 | 0 |

| Partial Sums Row 3 | | | | | | | | | |
|---|---|---|---|---|---|---|---|---|---|
| 0 | 0 | 2 | 3 | 0 | 0 | 4 | 0 | 5 | 6 |

| Partial Sums Row 4 | | | | | | | | | |
|---|---|---|---|---|---|---|---|---|---|
| 14 | 16 | 0 | 0 | 0 | 0 | 0 | 0 | 18 | 0 |

| Partial Sums Row 5 | | | | | | | | | |
|---|---|---|---|---|---|---|---|---|---|
| 0 | 0 | 0 | 0 | 0 | 0 | 0 | 0 | 0 | 0 |

| Partial Sums Row 6 | | | | | | | | | |
|---|---|---|---|---|---|---|---|---|---|
| 0 | 0 | 0 | 0 | 0 | 0 | 0 | 0 | 0 | 0 |

| Partial Sums Row 7 | | | | | | | | | |
|---|---|---|---|---|---|---|---|---|---|
| 0 | 0 | 0 | 0 | 0 | 0 | 0 | 0 | 0 | 0 |

| Partial Sums Row 8 | | | | | | | | | |
|---|---|---|---|---|---|---|---|---|---|
| 0 | 0 | 0 | 0 | 18 | 0 | 0 | 0 | 0 | 21 |

At a high level, this approach effectively organizes partial sums in rows instead of columns. For example, the parenthetical expressions in the first equation above correspond to the first elements of Partial Sums Rows 1-8, the parenthetical expressions in the second equation above correspond to the second elements of Partial Sums Rows 1-8, and the parenthetical expressions in the third equation above correspond to the third elements of Partial Sums Rows 1-8. To generate product matrix 106, Partial Sums Rows 1-8 are added together, such as by accumulation into a memory address range allocated for product matrix 106. Notably, Partial Sums Rows 1-2 and 5-7 contribute nothing to the generation of product matrix 106, because each of their elements has a value of zero. Advantageously, this approach facilitates avoiding generation of such rows, thereby conserving computational resources.

To generate a row of partial sums, a particular element of first sparse matrix 102 is multiplied to each element in a particular row of second sparse matrix 104. The particular row of second sparse matrix 104 corresponds to a column index of the particular element of first sparse matrix 102. For example, the first element of first sparse matrix 102 would be multiplied with each element in the first row of second sparse matrix 104, the second element of first sparse matrix 102 would be multiplied with each element in the second row of second sparse matrix 104, the third element of first sparse matrix 102 would be multiplied with each element in the third row of second sparse matrix 104, and so forth.

Accordingly, to avoid generating unnecessary rows of partial sums, any elements of first sparse matrix 102 having a value of zero may be safely ignored during sparse matrix multiplication. This is because multiplication involving such elements will inevitably result in a row of zero values. For the same reason, any rows of second sparse matrix 104 that correspond to such elements may also be ignored. Thus, in the example of FIG. 1, only the third, fourth, and eighth elements of first sparse matrix 102 and the third, fourth, and eighth rows of second sparse matrix 104 would be necessary for generating product matrix 106.

In some embodiments, further conservation of computational resources may be achieved based on avoiding multiplication with any elements of second sparse matrix 104 having a value of zero. For example, any elements having a value of zero in the third row of second sparse matrix 104 may be effectively skipped such that the element "1" of first sparse matrix 102 is only multiplied with the elements "2", "3", "4", "5", and "6" of second sparse matrix 104.

Multiplying Compressed Sparse Matrices

Furthermore, storage resources may be conserved based on storing matrices in a compressed format that excludes any elements having a value of zero. A non-limiting example of such a format is the Compressed Sparse Row (CSR) format. Referring to FIG. 2, compressed representation 200 corresponds to second sparse matrix 104 stored in the CSR format. Compressed representation 200 includes three one-dimensional arrays: rows array 202, values array 204, and columns array 206. As used herein, an "array" refers to an array, a vector, and/or the like.

Values array 204 stores all non-zero values of a matrix in row major order. For example, skipping any values of zero in the first row of second sparse matrix 104 only leaves the non-zero values "1", "2", "3", "4", and "5", which are stored in values array 204. Values array 204 preserves the order in which the non-zero values are presented in the first row of second sparse matrix 104.

Columns array 206 stores a respective column index for each of the non-zero values stored in values array 204. The column index indicates which column of the matrix includes a particular non-zero value. For example, the first element of columns array 206 stores the column index "1". Assuming column indices ranging from "0" to "9", the column index "1" indicates that the first element of values array 204 is included in the second column of second sparse matrix 104.

Rows array 202 stores a respective element index for each row of a matrix. The element index indicates which element of columns array 206 corresponds to the first non-zero value for a row of the matrix. For example, the first element of rows array 202 stores the element index "0". Assuming column indices increasing sequentially from "0", the element index "0" indicates that the first element of columns array 206 corresponds to the first non-zero value in a row of second sparse matrix 104.

In some embodiments, rows array 202 may store n+1 elements, where n is the number of rows in a matrix. The extra element of rows array 202 may indicate where a new row of the matrix would have started if the matrix had an additional row. For example, the last element of rows array 202 may correspond to an element index of a NULL byte stored at the end of columns array 206. The extra element may be used to compute the length for a segment of values array 204 and/or columns array 206 that corresponds to the last row of the matrix. For example, the element "32" may be subtracted from the adjacent element "34" of rows array 202 to determine that values array 204 stores two non-zero values for the last row of second sparse matrix 104.

Although not shown in FIG. 2, a compressed representation of first sparse matrix 102 may have a similar format to that of compressed representation 200. However, if first sparse matrix 102 has only one row, a rows array for first sparse matrix 102 may be optional.

Likewise, a compressed representation of product matrix 106 may have a similar format to that of compressed representation 200. Like the compressed representation of first sparse matrix 102, a rows array for product matrix 106 may be optional if product matrix 106 has only one row. However, generating product matrix 106 in a compressed format may be too cumbersome, especially with regard to indexing. Thus, all or part of product matrix 106 may be generated in an uncompressed format prior to being stored in a compressed format.

The following pseudocode provides an example approach for generating product matrix 106 based on multiplying compressed representations of first sparse matrix 102 and second sparse matrix 104.

```
/* A represents first sparse matrix 102 */
/* rowsA represents a rows array for first sparse matrix 102 */
/* valuesA represents a values array for first sparse matrix 102 */
/* columnsA represents a columns array for first sparse matrix 102 */
/* B represents second sparse matrix 104 */
/* rowsB represents rows array 202 */
/* valuesB represents values array 204 */
/* columnsB represents columns array 206 */
/* C represents product matrix 106 */
/* rowC represents a row of product matrix 106 */
/* clear all values in C */
C = 0
/* iterate over rows of A */
for i in 1 to n
   /* clear the row of product matrix 106 corresponding to the current row of A */
   rowC = 0
   /* iterate over non-zero values of the current row of A */
```

```
    for j in columnsA(rowsA(i))
        /* iterate over non-zero values of the row of B corresponding to the
        current */
        /* non-zero value of A */
        for k in columnsB(rowsB(j))
            /* multiply the current non-zero value of A with the current
            non-zero */
            /* value of B and accumulate the product into rowC */
            rowC(k) += valuesA(rowsA(i) + j) * valuesB(rowsB(j) + k)
        end for
    end for
    /* store rowC in a compressed format */
    C(i) = compress(rowC)
end for
```

Although the pseudocode may resemble a particular programming language, it is written as a composite of multiple programming languages.

Memory Constraints

However, computing environments impose limitations on the performance of sparse matrix multiplication. Referring to FIG. 3, computing device 300 may be used to perform sparse matrix multiplication. Computing device 300 has a memory hierarchy in which scratchpad memory 302 is backed by main memory 304. Main memory 304 may be dynamic random-access memory (DRAM) that is coupled to static random-access memory (SRAM) via a local bus. Scratchpad memory 302 may be a particular type of SRAM that can be manually managed.

Both scratchpad memory 302 and main memory 304 are examples of addressable memory. Addressable memory is memory which can be referenced, such as by referring to a register storing a particular memory address, by an instruction that causes a processor to load data from the particular memory address to a register or to store data from a register to a particular memory address. However, scratchpad memory 302 differs from main memory 304 in that scratchpad memory 302 is typically smaller and faster than main memory 304.

Use of scratchpad memory 302 provides advantages. Like a L1 cache, scratchpad memory 302 is positioned close to processor registers and enables rapid retrieval of small amounts of data that are temporarily stored. For example, scratchpad memory 302 may store temporary results generated mid-computation by a processor. Unlike a L1 cache, however, data stored in scratchpad memory 302 is not always copied into main memory. Furthermore, typical cache management is under the control of hardware. In contrast, management of scratchpad memory 302 may be controlled by a programmer via software instructions that address memory locations in scratchpad memory 302. Thus, scratchpad memory 302 may be preferable to a L1 cache in applications where predictable timing is desirable, such as in real-time applications.

However, in some embodiments, scratchpad memory 302 may be a cache that is made to behave like a conventional scratchpad memory. For example, cache control instructions may be employed to provide a programmer with control over data stored in a L1 cache.

Scratchpad memory 302 may be electronically coupled to a core (not shown), such as a core of multi-core central processing unit (CPU) and/or a graphics processing unit (GPU), that performs sparse matrix multiplication. Each core of a multi-core CPU comprises separate circuitry on the same chip. Each core can separately execute a machine code instruction within the same clock cycles in which another core executes an instruction. For example, each core may perform sparse matrix multiplication on a different row of first sparse matrix 102 to generate a different row of product matrix 106. However, each core has its own scratchpad memory 302, which is inaccessible by any of the other cores.

To achieve faster performance of sparse matrix multiplication, a processor, such as a CPU or a GPU, may perform computations on data stored in scratchpad memory 302. The processor may be coupled to registers that are used to execute an instruction set. The instruction set may include instructions which, when executed by the processor, cause the processor to generate a result using data in one or more registers as input and to store the result in a register. Some of the instructions may cause the data to be read from scratchpad memory 302 to a register and/or to store data from a register to scratchpad memory 302.

The data stored in scratchpad memory 302 may be fetched and/or prefetched from main memory 304 based on actual need and/or anticipated need. For example, compressed representations of first sparse matrix 102 and second sparse matrix 104 may be stored in main memory 304, and all or part of the compressed representations may be fetched and/or prefetched into scratchpad memory 302.

Furthermore, data stored in scratchpad memory 302 may be moved to main memory 304 to conserve storage resources. For example, there may be insufficient space in scratchpad memory 302 to store multiple rows of product matrix 106. Thus, after a row of product matrix 106 is generated in scratchpad memory 302, the row may be moved to main memory 304.

However, each time data is moved between main memory 304 and scratchpad memory 302, there is an associated cost in terms of clock cycles and/or computational resources, and this cost may create a bottleneck. For example, product matrix 106 may be too large to remain stored in scratchpad memory 302. Accordingly, the aforementioned pseudocode may be bottlenecked by the need to repeatedly move product matrix 106 (or as much of it as will fit in scratchpad memory 302) between scratchpad memory 302 and main memory 304.

Multiplying Partitioned Sparse Matrices

Although product matrix 106, in its entirety, may be too large to remain stored in scratchpad memory 302, there may be sufficient space in scratchpad memory 302 for a partition of product matrix 106 to remain stored for multiple sets of accumulate operations. Referring to FIG. 4, partition 400 corresponds to the first half of product matrix 106. Partition boundary 402 marks the end of partition 400. As used herein, a "partition length" corresponds to the number of columns in a partition. For example, partition 400 has a partition length of five. In some embodiments, each partition of product matrix 106 may have an equivalent partition length. In some embodiments, one or more partitions of product matrix 106 may have a different partition length.

Notably, partition 400 has the same partition length as partition 404 of second sparse matrix 104. This is because only the columns of second sparse matrix 104 that precede partition boundary 406 are used to generate partition 400 of product matrix 106. In other words, the columns of partition 400 correspond to the columns of partition 404, and partition boundary 402 corresponds to partition boundary 406. Thus, the aforementioned pseudocode may generate partition 400 based on the following operations:

move partition 400 from main memory 304 to scratchpad memory 302;
accumulate the set of partial sums "2" and "3" into partition 400;
accumulate the set of partial sums "14" and "16" into partition 400;
accumulate the set of partial sum "18" into partition 400;
move partition 400 from scratchpad memory 302 to main memory 304.

By obviating the need to repeatedly move partition 400 between scratchpad memory 302 and main memory 304 after "accumulate" operations, this approach results in significant savings in time and computational overhead, especially when multiple partitions of product matrix 106 are generated concurrently based on assigning a different partition to a different thread.

However, generating partition 400 of product matrix 106 based on partition 404 of second sparse matrix 104 may be difficult. This is because partition 400 is generated in an uncompressed format based on compressed representation 200 of second sparse matrix 104. As mentioned above, values array 204 contiguously stores non-zero values in a one-dimensional data structure. Thus, it would be difficult to determine whether or not a particular non-zero value corresponds to an element of partition 404 that is involved in generating partition 400.

One solution involves partitioning an uncompressed representation of second sparse matrix 104 and then creating a separate compressed representation for each partition, for example, during a pre-processing phase. However, this solution may incur significant storage and/or computational overhead, especially since rows array 202 would have to be stored in its entirety for each partition.

Furthermore, although different partitions of second sparse matrix 104 appear to have equivalent sizes when uncompressed, the different partitions may have different sizes when compressed. This is because sparsity may vary from row to row and/or from partition to partition. Thus, for relatively sparse rows, a small number of non-zero values may be retrieved into scratchpad memory 302, thereby resulting in underutilization of memory bandwidth.

Thus, what is needed is a hardware-conscious approach for efficiently performing sparse matrix multiplication.

BRIEF DESCRIPTION OF THE DRAWINGS

In the drawings:

FIG. 1 depicts example matrices.

FIG. 2 depicts an example compressed representation of a sparse matrix.

Figure 3:
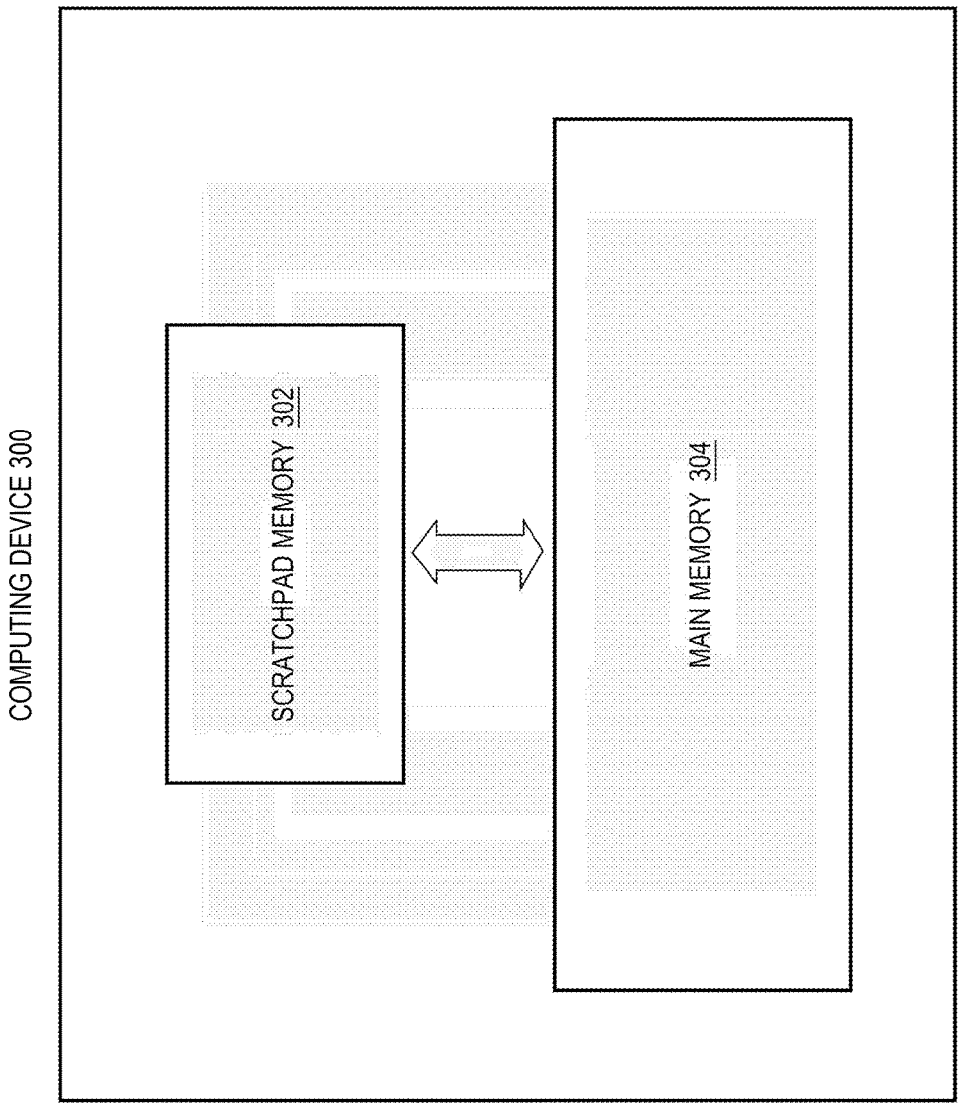
FIG. 3 depicts an example computer architecture on which embodiments may be implemented.
Figure 4:
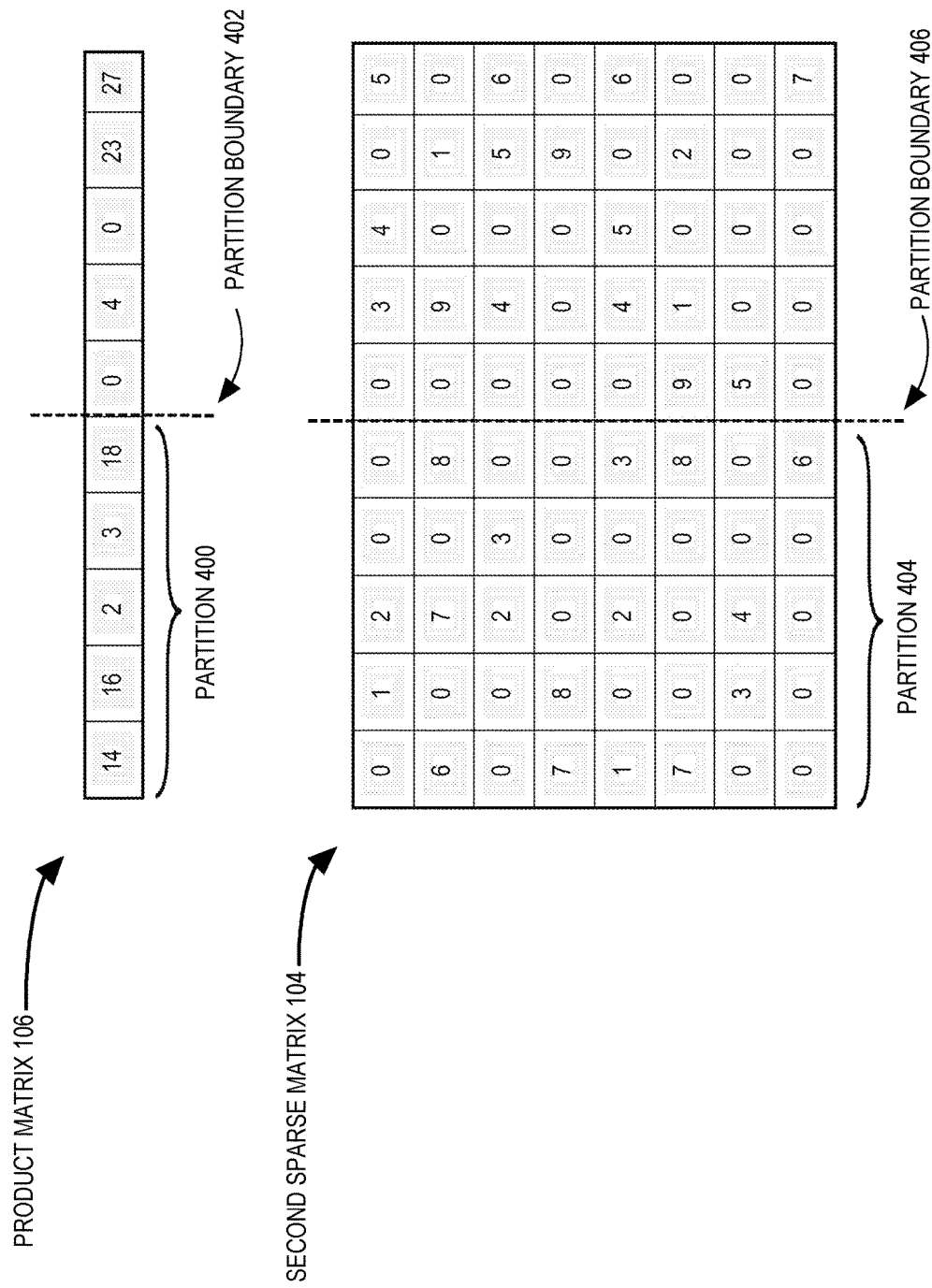
FIG. 4 depicts example partitions of uncompressed matrices.

While each of the drawing figures depicts a particular embodiment for purposes of depicting a clear example, other embodiments may omit, add to, reorder, and/or modify any of the elements shown in the drawing figures. For purposes of depicting clear examples, one or more figures may be described with reference to one or more other figures, but using the particular arrangement depicted in the one or more other figures is not required in other embodiments.

DETAILED DESCRIPTION

In the following description, for the purposes of explanation, numerous specific details are set forth in order to provide a thorough understanding of the present disclosure. It will be apparent, however, that the present disclosure may be practiced without these specific details. In other instances, well-known structures and devices are shown in block diagram form in order to avoid unnecessarily obscuring the present disclosure. Modifiers such as "first" and "second" may be used to differentiate elements, but the modifiers do not necessarily indicate any particular order.

Introduction

Techniques related to memory management for sparse matrix multiplication are disclosed. The techniques include two schemes for logically dividing a compressed representation of a sparse matrix—a scheme based on partitions and a scheme based on tiles. Using the two schemes together, physically dividing the compressed representation into a plurality of smaller compressed representations may be avoided. Furthermore, elements of the compressed representation may be retrieved in a manner that maximizes memory bandwidth.

In some embodiments, one or more computing devices may perform a method for multiplying a row of a first sparse matrix with a second sparse matrix to generate a product matrix row. The one or more computing devices comprise main memory and scratchpad memory. A compressed representation of the entire first sparse matrix and a compressed representation of the entire second sparse matrix may be stored in the main memory. An uncompressed representation of the product matrix row is generated in the scratchpad memory.

Generating the product matrix row involves generating a partition of the product matrix row. The partition has a size that enables it to remain cached in the scratchpad memory until the partition is completely computed and/or ready for compression. The size of the partition is dynamically determined for each row of the first sparse matrix. More specifically, the size of the partition depends on the number of non-zero values in a corresponding row of the first sparse matrix.

The partition of the product matrix row is generated based on elements in a corresponding partition of the second sparse matrix. More specifically, the corresponding partition includes non-zero values of second sparse matrix rows that are to be multiplied with non-zero values in the row of the first sparse matrix. To enable faster performance of multiplication, at least some of the elements are fetched and/or prefetched into the scratchpad memory, from the main memory, based on actual need and/or anticipated need for performing the multiplication.

Furthermore, to maximize memory bandwidth, at least some of the elements are fetched and/or prefetched as one or more sets of tiles that, together with the partition of the product matrix row, collectively occupy as much of the scratchpad memory as possible. Each set of tiles corresponds to a different row of the second sparse matrix.

In some embodiments, a particular tile may include more elements than necessary to generate a particular partition of the product matrix row. In such embodiments, any unnecessary elements in the particular tile may remain stored in the scratchpad memory for generation of another partition of the product matrix row.

In some embodiments, a particular tile may include fewer elements, of a particular second sparse matrix row, than necessary to generate a particular partition of the product matrix row. In such embodiments, another tile may be loaded into the scratchpad memory. The another tile may include one or more elements, of the particular second sparse matrix row, that were excluded from the particular tile.

Partitions of Compressed Sparse Matrices

Figure 5:
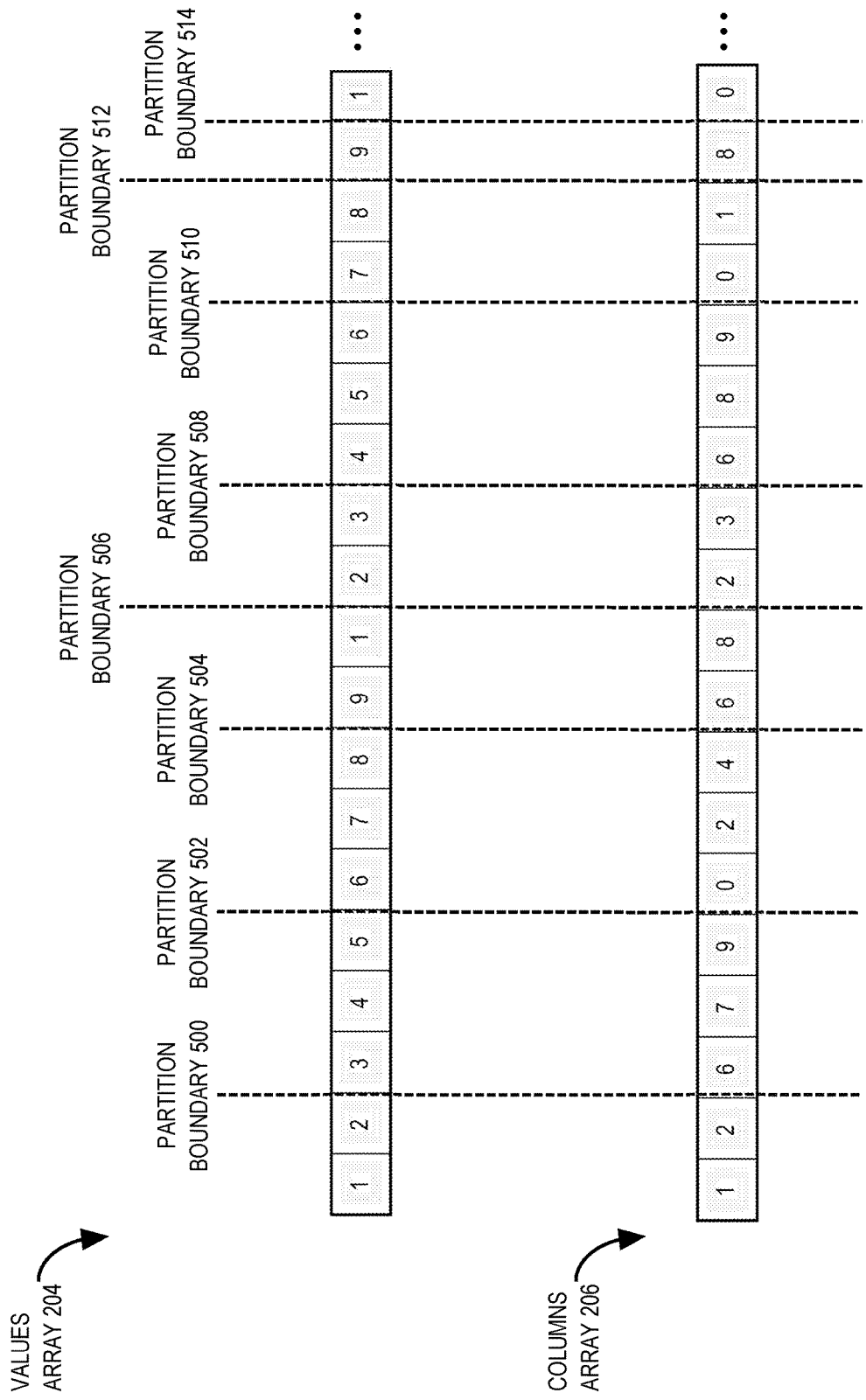
FIG. 5 depicts example partitions of a compressed sparse matrix.

Instead of generating multiple compressed representations that respectively correspond to multiple partitions of second sparse matrix 104, a single compressed representation of second sparse matrix 104 may be logically divided into multiple partitions. Referring to FIG. 5, values array 204 and columns array 206 are analogously partitioned by partition boundaries 500-514. Notably, values array 204 and columns array 206 are not divided along partition boundaries 500-514 into subarrays. Instead, values array 204 and columns array 206 remain intact as arrays included in compressed representation 200 of second sparse matrix 104 in its entirety.

Partition boundaries 502, 506, 510, and 514 separate values array 204 and columns array 206 into rows. For example, partition boundary 502 separates the element "5" of the first row of second sparse matrix 104 from the element "6" of the second row of second sparse matrix 104. Partition boundaries 502, 506, 510, and 514 may be indicated by elements of rows array 202.

Furthermore, partition boundaries 500, 504, 508, and 512 separate rows into partitions. For example, the elements that precede partition boundary 500 are included in partition 404, and the elements between partition boundary 500 and partition boundary 502 are included in a different partition of second sparse matrix 104. In other words, partition boundaries 500, 504, 508, and 512 may correspond to partition boundary 406.

Locations of partition boundaries 500-514 may be determined based on performing, at runtime, a linear search and/or a binary search on columns array 206 and determining corresponding locations in values array 204. For example, of the elements in columns array 206 that precede partition boundary 502, partition boundary 500 may be determined to precede the element having the smallest column index that is greater than "5". Since partition boundary 500 exists between the second and third elements of columns array 206, partition boundary 500 also exists between the second and third elements of values array 204. Thus, the elements "1" and "2" of values array 204 are determined to be included in partition 404.

A linear search may be performed to search a relatively small number of elements, because it incurs fewer branch mispredictions. However, for a relatively large number of elements, performing a binary search may be faster. Whether a linear search or a binary search is performed may be determined based on a threshold number of elements to be searched. For example, if the threshold number is ten elements, then the location of partition boundary 500 may be determined based on performing a linear search.

As used herein, a "virtual tile" refers to a segment of values array 204 or columns array 206 that is bounded by a pair of adjacent partition boundaries or that is bounded by a partition boundary and an adjacent end of an array. In other words, an uncompressed representation of a virtual tile has a length that is equal to the partition length of a corresponding partition.

Tiles of Compressed Sparse Matrices

Typically, achieved memory bandwidth increases as the amount of data retrieved into scratchpad memory 302 in a single transfer increases, up to the point where the physically possible maximum memory bandwidth is achieved. Accordingly, to maximize memory bandwidth, as many elements as possible should be retrieved, into scratchpad memory 302, for each relevant row of second sparse matrix 104. As mentioned above, rows of second sparse matrix 104 that are "relevant" are the rows that correspond to the column indices of any non-zero values in first sparse matrix 102.

Figure 6:
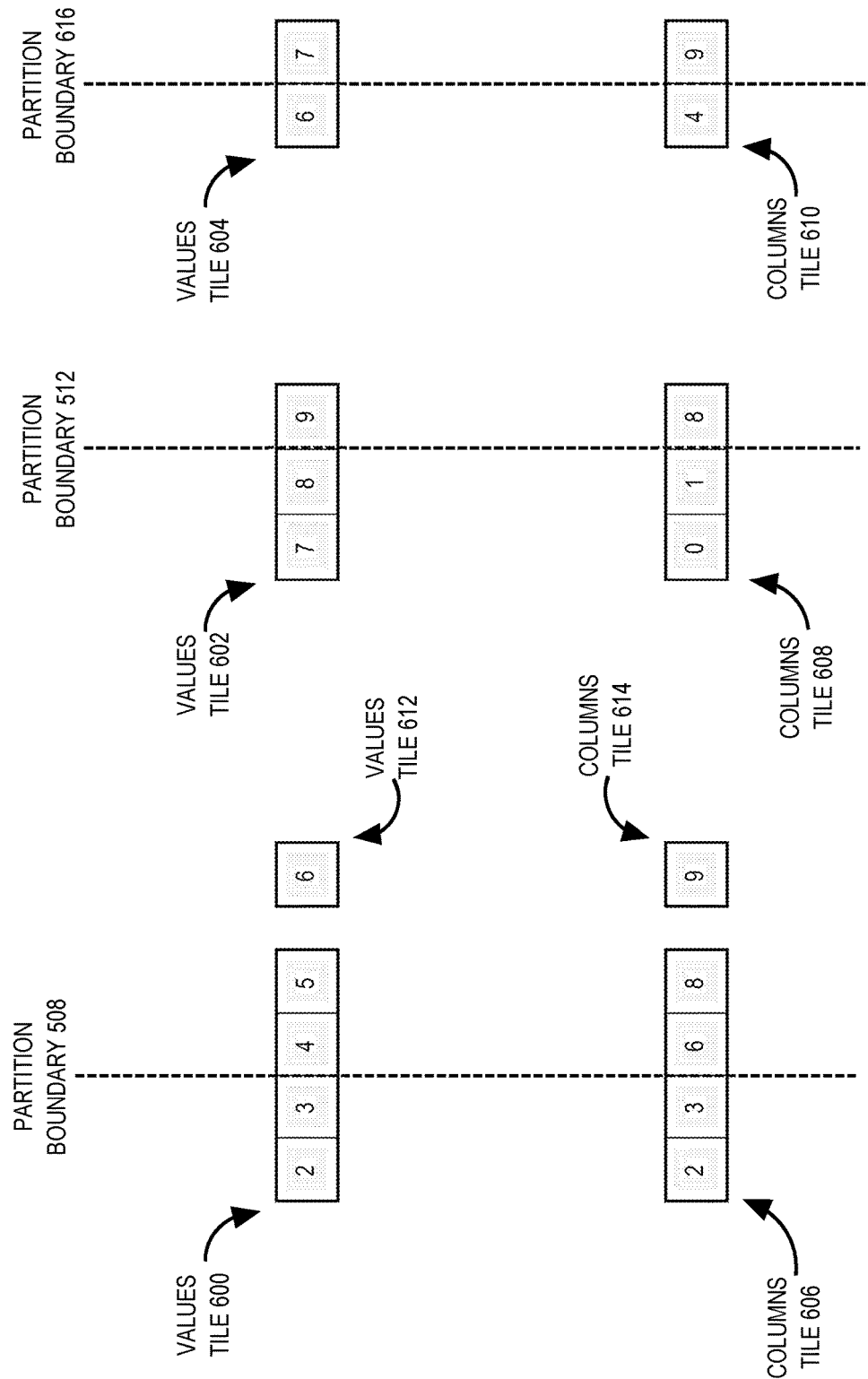
FIG. 6 depicts example tiles of a compressed sparse matrix.

Referring to FIG. 6, the relevant rows are the third, fourth, and eighth rows. Values tiles 600-604, 612 and columns tiles 606-610, 614 are segments of values array 204 and columns array 206, respectively, that correspond to the relevant rows. Values tiles 600, 612 and columns tiles 606, 614 correspond to the third row of second sparse matrix 104; values tile 602 and columns tile 608 correspond to the fourth row of second sparse matrix 104; and values tile 604 and columns tile 610 correspond to the eighth row of second sparse matrix 104. As used herein, a "tile" or a "physical tile" refers to a segment of values array 204 or columns array 206 corresponding to a logical unit of contiguous elements that are concurrently retrieved into scratchpad memory 302 to maximize memory bandwidth. As will be described in greater detail below, determining a maximum number of elements to be concurrently retrieved into scratchpad memory 302 depends on the amount of scratchpad memory 302 that is available.

In the example of FIG. 6, assume for the sake of illustration that memory bandwidth is determined to be maximized when four elements of values array 204 and four elements of columns array 206 are retrieved into scratchpad memory 302 for each relevant row. For example, since the third row of second sparse matrix 104 includes five non-zero values, four of them may be retrieved together as values tile 600 to maximize memory bandwidth. Additionally, four corresponding column indices may be retrieved as columns tile 606. After the elements "2", "3", "4", and "5" are used to perform matrix multiplication, a different tile storing no more than four elements may be retrieved into scratchpad memory 302. However, since there is only one non-zero value remaining in the third row of second sparse matrix 104, the different tile stores one element—the element "6"—which is retrieved as values tile 612 along with corresponding columns tile 614.

Similarly, since the fourth and eighth rows include less than four elements each, all three elements of the fourth row and all two elements of the eighth row are retrieved as values tiles 602 and 604, respectively. Additionally, three corresponding column indices and two corresponding column indices may be retrieved as columns tiles 608 and 610. Notably, no further tiles are retrieved for the fourth and eighth rows.

Thus, at time T1, values tiles 600-604 and columns tiles 606-610 are fetched and/or prefetched into scratchpad memory 302. Subsequently, at time T2, values tile 612 and columns tile 614 are fetched and/or prefetched into scratchpad memory 302.

Physical tiles often differ in size from virtual tiles. For example, values tile 600 and values tile 612 correspond to a first physical tile and a second physical tile, respectively. However, the elements "2" and "3" correspond to a first virtual tile, and the elements "4", "5", and "6" correspond to a second virtual tile. Notably, loading the four elements of the first physical tile utilizes memory bandwidth more efficiently than loading only the two elements of the first virtual tile. Nevertheless, when used together, physical tiles and virtual tiles facilitate efficient multiplication of sparse matrices.

In the example of FIG. 6, partition boundaries 508, 512, and 616 exist within physical tiles, thereby illustrating instances when a physical tile includes multiple virtual tiles. In such instances, instead of discarding the illustrated elements that follow partition boundaries 508, 512, and 616, the elements may remain stored in scratchpad memory 302 for use in computing a subsequent partition of second sparse matrix 104.

In the example of FIG. 6, values tile 612 and part of values tile 600 follow partition boundary 508, thereby illustrating an instance when a virtual tile includes multiple physical tiles. In such instances, after the elements "4" and "5" in values tile 600 are used to compute a particular partition of second sparse matrix 104, values tile 600 and columns tile 606 may be evicted from scratchpad memory 302. Furthermore, values tile 612 and columns tile 614 may be retrieved into scratchpad memory 302 to enable the particular partition to be computed with the element "6".

The following pseudocode provides an example approach for generating product matrix 106 based on multiplying compressed representations of first sparse matrix 102 and second sparse matrix 104 using virtual tiles and physical tiles.

```
/* A represents first sparse matrix 102 */
/* rowsA represents a rows array for first sparse matrix 102 */
/* valuesA represents a values array for first sparse matrix 102 */
/* columnsA represents a columns array for first sparse matrix 102 */
/* B represents second sparse matrix 104 */
/* rowsB represents rows array 202 */
/* valuesB represents values array 204 */
/* columnsB represents columns array 206 */
/* C represents product matrix 106 */
/* rowC represents a row of product matrix 106 */
/* p_length represents physical tile size */
/* v_length represents virtual tile size */
/* vc_start represents a column in B where a virtual tile starts */
/* vc_end represents a column in B where a virtual tile ends */
/* b_col_start represents an element index of columnsB where row j of B starts */
/* b_col_end represents an element index of columnsB where row j of B ends */
/* b_col_it represents an "iterator" that marks a position between b_col_start to b_col_end */
/* p_size represents a number of elements fetched from main memory in a physical tile */
/* p_columns represents a portion of columnsB fetched in a physical tile */
/* p_values represents a portion of valuesB fetched in a physical tile */
/* p_it represents an "iterator" that marks a position between 0 to p_size in a physical tile */
/* pv_end identifies the end of a virtual tile in a physical tile between p_it to p_size */
/* clear all values in C */
C = 0
/* iterate over rows of A */
for i in 1 to n
    /* iterate over each virtual tile in B */
    for l in 1 to v_length
        /* identify the beginning of the current partition of B */
        vc_start = (l - 1) * v_length + 1
        /* identify the end of the current partition of B */
        vc_end = vc_start + v_length
        /* clear the row of product matrix 106 corresponding to the current row of A */
        rowC = 0
                /* Initialization Loop */
        /* perform an iteration for each non-zero value in the current row of A */
        for j in 1 to columnsA(rowsA(i))
            /* set a columnsB iterator to an element index corresponding to the first */
            /* value in valuesB to be multiplied to the current non-zero value of A */
            b_col_start(j) = b_col_it(j) = rowsB(j)
            /* identify the element index of columnsB corresponding to the last */
            /* value in valuesB to be multiplied to the current non- zero value of A */
            b_col_end(j) = rowsB(j + 1) - 1
            /* initialize a physical tile iterator */
            p_it(j) = 0
            /* determine a size for a physical tile based on p_length or the number */
            /* of non-zero values of B to be multiplied to the current non zero value */
            /* of A, whichever is smaller */
            p_size(j) = min(p_length, (b_col_end(j) - b_col_it(j)))
            /* retrieve two physical tiles having p_size elements from columnsB */
            /* and valuesB to be multiplied to the current non-zero value of A */
            /* p_columnsj(j), p_values(j) = fetch_physical_title(p_size)
```

```
    /* advance the columnsB iterator to the beginning of any subsequent */
    /* physical tile for the current row of B */
    b_col_it(j) += p_size
  end for
  /* again, iterate over non-zero values of the current row of A */
  for j in 1 to columnsA(rowsA(i))
    do
      /* perform a linear search or a binary search for the end of the */
      /* current partition of B in p_columns and set it to pv_end */
      pv_end = search_physical_title_(p_columns, vc_end)
      /* iterate over values of p_values */
      for k in p_it to pv_end
        /* multiply the current non-zero value of A to the current */
        /* value of B and accumulate the product into rowC */
        rowC(k) += valuesA(rowsA(i) + j) * p_values(k)
      end for
      /* advance the physical tile iterator to the end of the current */
      /* partition of B */
      p_it(j) = pv_end
      /* determine if the virtual tile ends before the physical tile */
      if p_it(j) < p_size
        /* proceed to the next non-zero value of A */
        break
      end if
      /* since the physical tile ended before the virtual tile, determine */
      /* a size for another physical tile based on p_length or the */
      /* number of remaining non-zero values of B to be multiplied to */
      /* the current non-zero value of A, whichever is smaller */
      p_size(j) = min(p_length, (b_col_end(j) - b_col_it(j)))
      /* retrieve two more physical tiles having p_size elements from */
      /* columnsB and valuesB for the same row of B */
      p_columns(j), p_values(j) =fetch_physical_tile(p_size)
      /* advance the columnsB iterator to the beginning of any */
      /* subsequent physical tile for the current row of B */
      b_col_it(j) =+p_size
    /* determine if the end of the current row of B has been reached */
    while p_size > 0
  end for
 end for
 /* store rowC in a compressed format */
 C(i) =compress(rowC)
end for
```

Although the pseudocode may resemble a particular programming language, it is written as a composite of multiple programming languages.

As mentioned above, physical tiles are retrieved into scratchpad memory 302, thereby enabling the "generation" loop of the pseudocode, which is included in the second box above, to be performed entirely out of scratchpad memory 302. Notably, the "initialization" loop of the pseudocode, which is included in the first box above, causes retrieval of a set of two physical tiles—"p_values" and "p_columns"—for each non-zero value in a particular row of first sparse matrix 102. If each element in a tile is represented using "e" number of bytes, each physical tile uses "e*p_length" bytes of scratchpad memory 302. Furthermore, a pair of physical tiles would use "2e*p_length" bytes of scratchpad memory 302. If "h" represents the number of non-zero values in the particular row of first sparse matrix 102, the physical tiles retrieved for the particular row would be stored using "h*(2e*p_length)" bytes of scratchpad memory 302.

Additionally, for each non-zero value in a particular row of first sparse matrix 102, the following processing state may also be stored in scratchpad memory 302: "b_col_it", "b_col_start", "b_col_end", "p_it", and "p_end". Since there are five types of state for each non-zero value of first sparse matrix 102, the processing state is stored using "h*5e" bytes of scratchpad memory 302. Thus, the amount of scratchpad memory 302 used to store physical tiles and processing state for any given row of first sparse matrix 102 may be expressed as "h*(2e*p_length+5e)".

As mentioned above, scratchpad memory 302 also stores a partition of a product matrix row that corresponds to the particular row of first sparse matrix 102. This partition may be stored using "e*v_length" bytes of scratchpad memory 302. If "available_scratchpad_memory" represents the amount of scratchpad memory 302 available for the aforementioned pseudocode, the relationship between virtual tile size and physical tile size may be described using the following formula.

$$h*(2e*p\_length+5e)+ e*v\_length \leq available\_scratchpad\_memory$$

Typically, "e" is known beforehand. For example, if "e" is known to be four bytes, the aforementioned formula would be as follows.

$$h*(8*p\_length+20)+4*v\_length \leq available\_scratchpad\_memory$$

For any given row of first sparse matrix 102, "h" may be easily determined. In turn, "h" may affect "p_length" and/or "v_length". In other words, the number of non-zero values included in a physical tile and/or a virtual tile may be dynamically determined for each row of first sparse matrix 102.

However, "p_length" is typically measured as the minimum value necessary for a particular memory hierarchy to achieve maximum memory bandwidth. Thus, "v_length" is typically determined based on solving the aforementioned formula.

Partitioning in Multiple Dimensions

As mentioned above, sparse matrix multiplication may be efficiently performed based on vertical partitions of second sparse matrix 104, and lengths of the vertical partitions may be determined based on the aforementioned formula. However, in some embodiments, "h" and "p_length" may be sufficiently large that a solution for "v_length" cannot be determined. In such embodiments, second sparse matrix 104 may be further partitioned horizontally.

For example, second sparse matrix 104 may be divided into the following four partitions.

| Partition A | | | | |
|---|---|---|---|---|
| 0 | 1 | 2 | 0 | 0 |
| 6 | 0 | 7 | 0 | 8 |
| 0 | 0 | 2 | 3 | 0 |
| 7 | 8 | 0 | 0 | 0 |

| Partition B | | | | |
|---|---|---|---|---|
| 0 | 3 | 4 | 0 | 5 |
| 0 | 9 | 0 | 1 | 0 |
| 0 | 4 | 0 | 5 | 6 |
| 0 | 0 | 0 | 9 | 0 |

| Partition C | | | | |
|---|---|---|---|---|
| 1 | 0 | 2 | 0 | 3 |
| 7 | 0 | 0 | 0 | 8 |
| 0 | 3 | 4 | 0 | 0 |
| 0 | 0 | 0 | 0 | 6 |

| Partition D | | | | |
|---|---|---|---|---|
| 0 | 4 | 5 | 0 | 6 |
| 9 | 1 | 0 | 2 | 0 |
| 5 | 0 | 0 | 0 | 0 |
| 0 | 0 | 0 | 0 | 7 |

Partition A includes columns 1-5 and rows 1-4 of second sparse matrix 104; Partition B includes columns 6-10 and rows 1-4 of second sparse matrix 104; Partition C includes columns 1-5 and rows 5-8 of second sparse matrix 104; and Partition D includes columns 6-10 and rows 5-8 of second sparse matrix 104.

In such embodiments, the aforementioned pseudocode may be modified such that each partition of a product matrix row is generated in multiple iterations over the columns of second sparse matrix 104. Each iteration may partially generate the product matrix row based on a horizontal partition of second sparse matrix 104. For example, a first iteration may involve partially generating product matrix 106 based on Partitions A and B, and a second iteration may involve partially generating product matrix 106 based on Partitions C and D. As used herein, "partially" generating all or part of product matrix 106 involves computing, accumulating, and/or storing partial sums.

Thus, each iteration may involve computing a respective set of one or more partial sums for each partition of the product matrix row. Furthermore, each iteration may involve storing, in main memory 304, each partially generated partition of the product matrix row. In some iterations, partially generated partitions may be retrieved into scratchpad memory 302 to further accumulate one or more partial sums. For example, a first iteration may involve partially generating a first partition of product matrix 106 based on Partition A, storing the first partition in main memory 304, partially generating a second partition of product matrix 106 based on Partition B, and storing the second partition in main memory 304. A second iteration may involve retrieving the first partition into scratchpad memory 302, completing generation of the first partition based on Partition C, storing the first partition in main memory 304, retrieving the second partition into scratchpad memory 302, completing generation of the second partition based on Partition D, and storing the second partition in main memory 304.

Notably, each horizontal partition involves a different set of physical tiles. Thus, a different set of physical tiles may be retrieved into scratchpad memory 302 along with a partially generated partition of product matrix 106. For example, a first iteration may involve computing partial sums based on physical tiles corresponding to the third and fourth rows of second sparse matrix 104, and a second iteration may involve computing other partial sums based on physical tiles corresponding to the eighth row of second sparse matrix 104.

Process Overview

Figure 7:
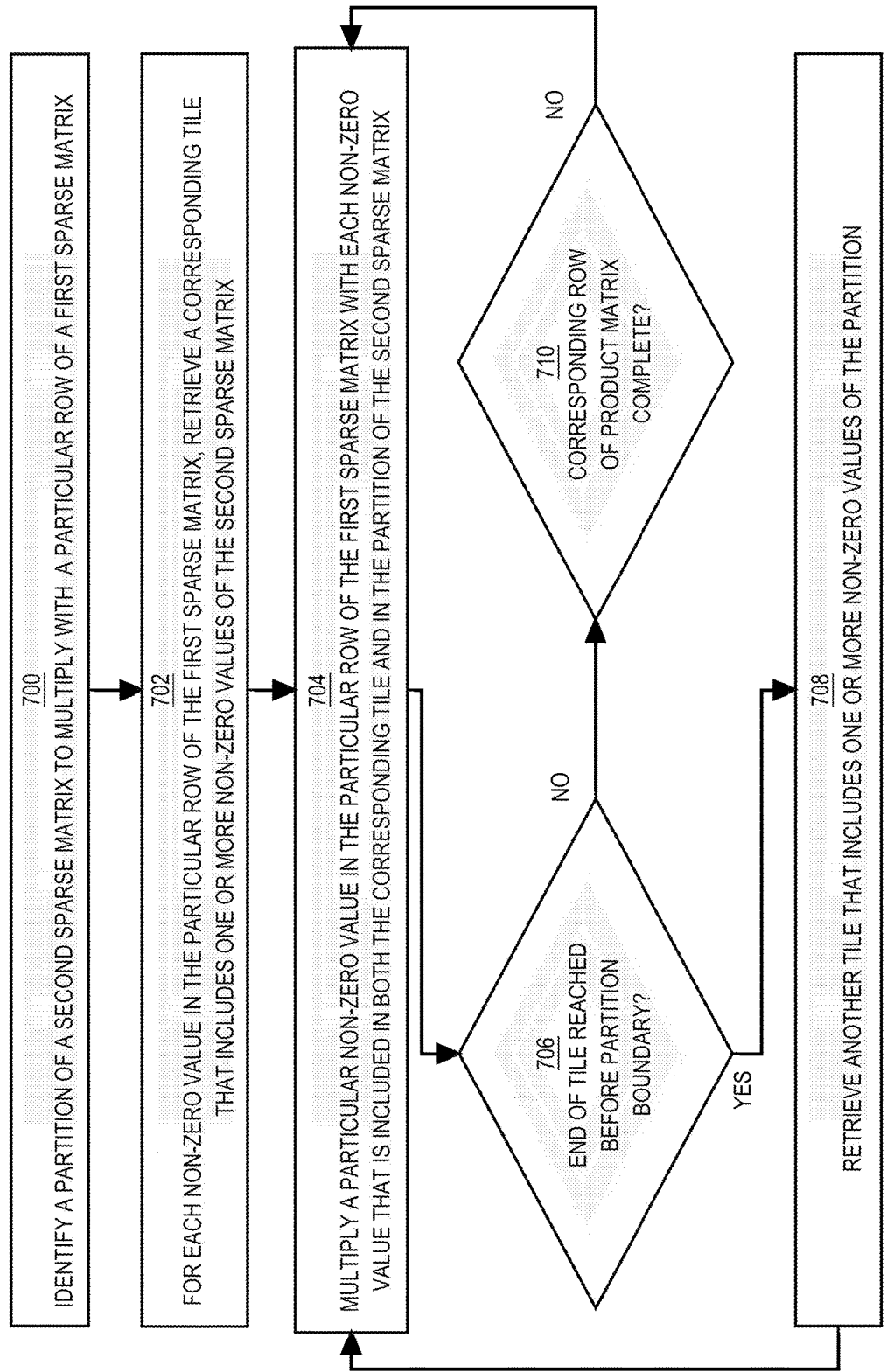
FIG. 7 is a flow diagram that depicts an approach for sparse matrix multiplication using partitions and tiles.

FIG. 7 is a flow diagram that depicts an approach for sparse matrix multiplication using partitions and tiles. One or more computing devices may perform the approach to multiply a row of a first sparse matrix with a second sparse matrix to generate a row of a product matrix. The one or more computing devices may include main memory that stores compressed representations of the first and second sparse matrices. The compressed representations may include a values array and a columns array for the first and second sparse matrices. A values array stores non-zero values of a sparse matrix, and a columns array stores column indices respectively corresponding to the non-zero values.

At block 700, a partition of the second sparse matrix is identified. The partition is to be multiplied with the row of the first sparse matrix to generate a corresponding partition of the row of the product matrix. Boundaries of the partition are determined based on boundaries of the corresponding partition, which may be determined based on an amount of scratchpad memory that is available for storing the corresponding partition.

At block 702, for each non-zero value in the row of the first sparse matrix, a corresponding tile is loaded into the scratchpad memory. Each corresponding tile is a portion of the values array for the second sparse matrix. Each portion of the values array corresponds to a respective row of the second sparse matrix that is to be multiplied with a non-zero value of the first sparse matrix. Tile size may be determined based on measuring for a minimum number of elements to be included in a tile to achieve peak memory bandwidth.

At block 704, a particular non-zero value of the first sparse matrix is multiplied with each non-zero value that is included in both a loaded tile and the partition of the second sparse matrix. The resulting products are accumulated as partial sums into the corresponding partition of the row of the product matrix that is stored in the scratchpad memory.

At block 706, a determination is made as to whether the end of a loaded tile has been reached before the end of the partition of the second sparse matrix. This determination may be made based on performing a linear search or a binary search for a partition boundary on a portion of a columns array that corresponds to the loaded tile. If the end of the loaded tile has been reached before the end of the partition, block 706 proceeds to block 708. In other words, it has been determined that another tile is required to generate the corresponding partition of the row of the product matrix. Otherwise, block 706 proceeds to block 710.

At block 708, the loaded tile is evicted from the scratchpad memory, and the another tile is loaded into the scratchpad memory. The another tile includes one or more non-zero values of the partition of the second sparse matrix. Block 708 returns to block 704 to further generate the corresponding partition of the row of the product matrix.

By block 710, it has already been determined that the end of the loaded tile has not been reached before the end of the partition of the second sparse matrix. Thus, either the end of the loaded tile coincides with the end of the partition or the end of the partition has been reached before the end of the loaded tile. In either case, the end of the partition has been reached. Accordingly, a determination may be made, at block 710, as to whether a row of the product matrix that corresponds with the row of the first sparse matrix has been completely generated. If not, block 710 returns to block 704 to further generate the corresponding partition of the row of the product matrix or to generate another partition of the row of the product matrix.

Otherwise, block 710 may return to block 700 to generate any other rows of the product matrix. In some embodiments, block 710 may proceed to an optional block (not shown) where the completed row of the product matrix is stored in the main memory. In some embodiments, the completed row of the product matrix may be stored in a compressed format, such as a CSR format. In some embodiments, compression may involve using a hash table or a bit vector generated at runtime.

Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors (e.g. CPUs, GPUs) programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 8:
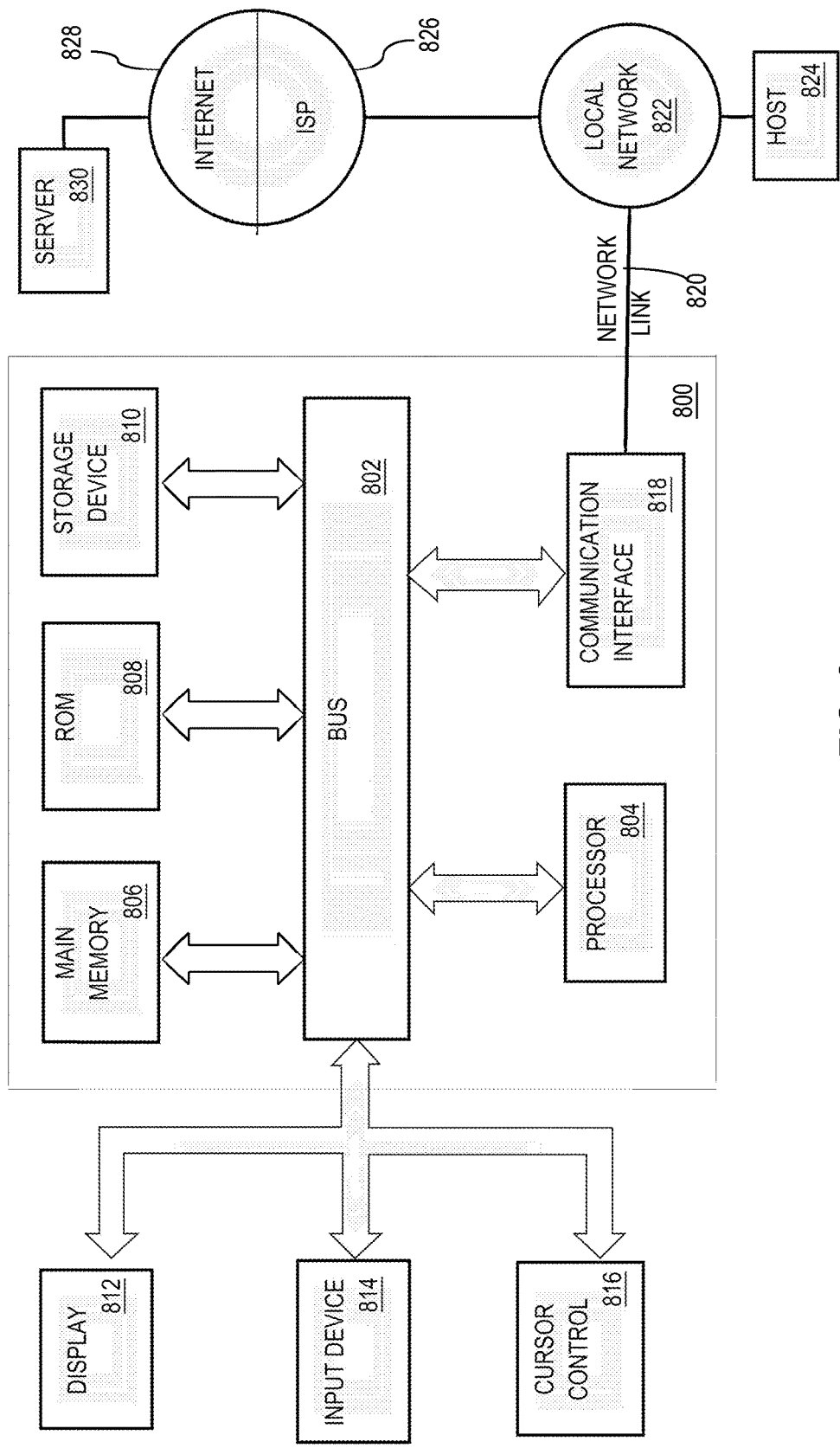
FIG. 8 depicts a computer system upon which an embodiment may be implemented.

For example, FIG. 8 is a block diagram that illustrates a computer system 800 upon which an embodiment of the disclosure may be implemented. Computer system 800 includes a bus 802 or other communication mechanism for communicating information, and a hardware processor 804 coupled with bus 802 for processing information. Hardware processor 804 may be, for example, a general purpose microprocessor.

Computer system 800 also includes a main memory 806, such as a random access memory (RAM) or other dynamic storage device, coupled to bus 802 for storing information and instructions to be executed by processor 804. Main memory 806 also may be used for storing temporary variables or other intermediate information during execution of instructions to be executed by processor 804. Such instructions, when stored in non-transitory storage media accessible to processor 804, render computer system 800 into a special-purpose machine that is customized to perform the operations specified in the instructions.

Computer system 800 further includes a read only memory (ROM) 808 or other static storage device coupled to bus 802 for storing static information and instructions for processor 804. A storage device 810, such as a magnetic disk, optical disk, or solid-state drive is provided and coupled to bus 802 for storing information and instructions.

Computer system 800 may be coupled via bus 802 to a display 812, such as a cathode ray tube (CRT), for displaying information to a computer user. An input device 814, including alphanumeric and other keys, is coupled to bus 802 for communicating information and command selections to processor 804. Another type of user input device is cursor control 816, such as a mouse, a trackball, or cursor direction keys for communicating direction information and command selections to processor 804 and for controlling cursor movement on display 812. This input device typically has two degrees of freedom in two axes, a first axis (e.g., x) and a second axis (e.g., y), that allows the device to specify positions in a plane.

Computer system 800 may implement the techniques described herein using customized hard-wired logic, one or more ASICs or FPGAs, firmware and/or program logic which in combination with the computer system causes or programs computer system 800 to be a special-purpose machine. According to one embodiment, the techniques herein are performed by computer system 800 in response to processor 804 executing one or more sequences of one or more instructions contained in main memory 806. Such instructions may be read into main memory 806 from another storage medium, such as storage device 810. Execution of the sequences of instructions contained in main memory 806 causes processor 804 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 810. Volatile media includes dynamic memory, such as main memory 806. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 802. Transmission media can also take the form of acoustic or light waves, such as those generated during radio-wave and infra-red data communications.

Various forms of media may be involved in carrying one or more sequences of one or more instructions to processor 804 for execution. For example, the instructions may initially be carried on a magnetic disk or solid-state drive of a remote computer. The remote computer can load the instructions into its dynamic memory and send the instructions over a telephone line using a modem. A modem local to computer system 800 can receive the data on the telephone line and use an infra-red transmitter to convert the data to an infra-red signal. An infra-red detector can receive the data carried in the infra-red signal and appropriate circuitry can place the data on bus 802. Bus 802 carries the data to main memory 806, from which processor 804 retrieves and executes the instructions. The instructions received by main memory 806 may optionally be stored on storage device 810 either before or after execution by processor 804.

Computer system 800 also includes a communication interface 818 coupled to bus 802. Communication interface 818 provides a two-way data communication coupling to a network link 820 that is connected to a local network 822. For example, communication interface 818 may be an integrated services digital network (ISDN) card, cable modem, satellite modem, or a modem to provide a data communication connection to a corresponding type of telephone line. As another example, communication interface 818 may be a local area network (LAN) card to provide a data communication connection to a compatible LAN. Wireless links may also be implemented. In any such implementation, communication interface 818 sends and receives electrical, electromagnetic or optical signals that carry digital data streams representing various types of information.

Network link 820 typically provides data communication through one or more networks to other data devices. For example, network link 820 may provide a connection through local network 822 to a host computer 824 or to data equipment operated by an Internet Service Provider (ISP) 826. ISP 826 in turn provides data communication services through the world wide packet data communication network now commonly referred to as the "Internet" 828. Local network 822 and Internet 828 both use electrical, electromagnetic or optical signals that carry digital data streams. The signals through the various networks and the signals on network link 820 and through communication interface 818, which carry the digital data to and from computer system 800, are example forms of transmission media.

Computer system 800 can send messages and receive data, including program code, through the network(s), network link 820 and communication interface 818. In the Internet example, a server 830 might transmit a requested code for an application program through Internet 828, ISP 826, local network 822 and communication interface 818.

The received code may be executed by processor 804 as it is received, and/or stored in storage device 810, or other non-volatile storage for later execution.

Software Overview

Figure 9:
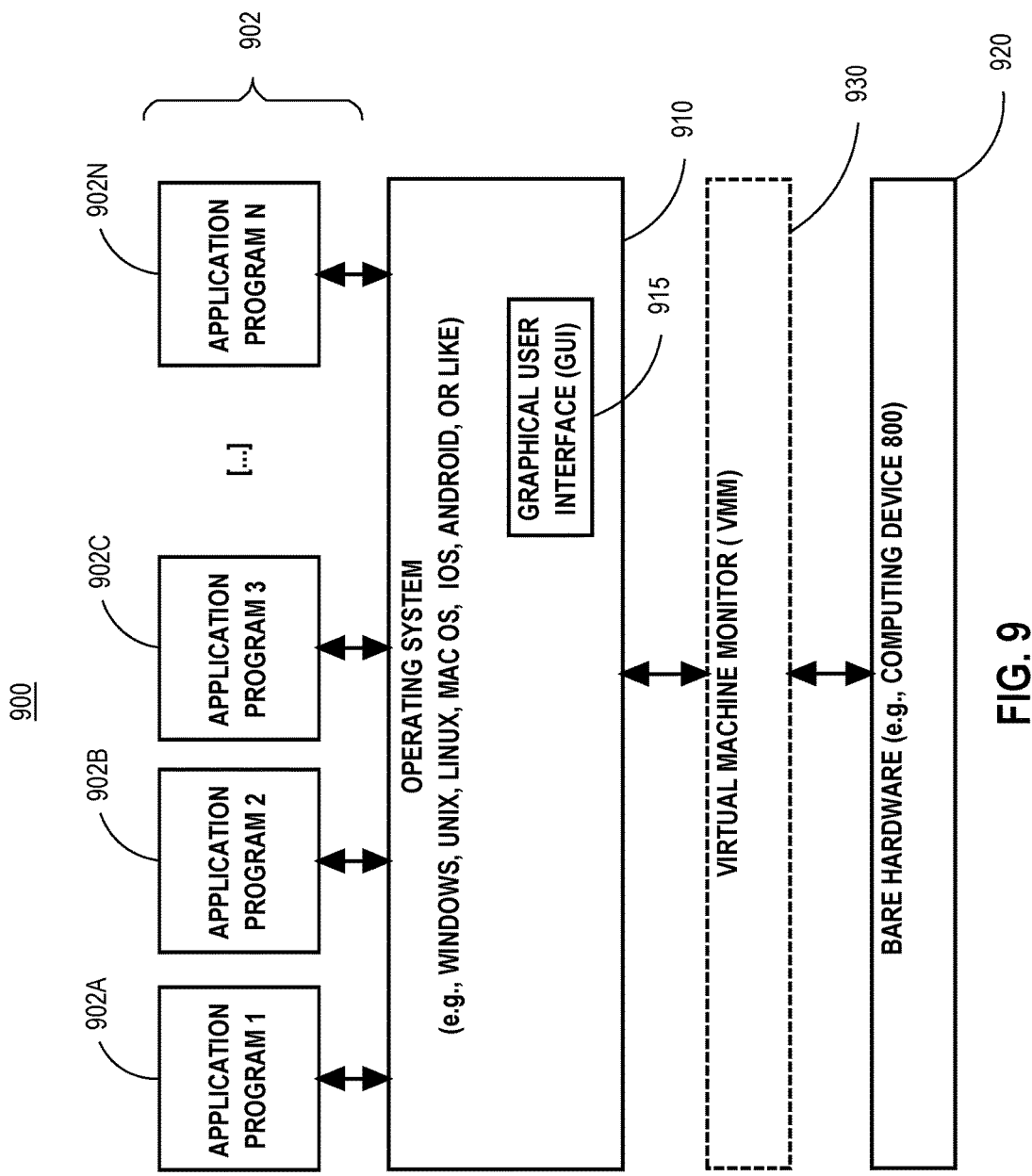
FIG. 9 depicts a software system for controlling the operation of the computer system.

FIG. 9 is a block diagram of a software system 900 that may be employed for controlling the operation of computer system 800. Software system 900 and its components, including their connections, relationships, and functions, is meant to be exemplary only, and not meant to limit implementations of the example embodiment(s). Other software systems suitable for implementing the example embodiment(s) may have different components, including components with different connections, relationships, and functions.

Software system 900 is provided for directing the operation of computer system 800. Software system 900, which may be stored in system memory (RAM) 806 and on fixed storage (e.g., hard disk or flash memory) 810, includes a kernel or operating system (OS) 910.

The OS 910 manages low-level aspects of computer operation, including managing execution of processes, memory allocation, file input and output (I/O), and device I/O. One or more application programs, represented as 902A, 902B, 902C . . . 902N, may be "loaded" (e.g., transferred from fixed storage 810 into memory 806) for execution by the system 800. The applications or other software intended for use on system 800 may also be stored as a set of downloadable computer-executable instructions, for example, for downloading and installation from an Internet location (e.g., a Web server, an app store, or other online service).

Software system 900 includes a graphical user interface (GUI) 915, for receiving user commands and data in a graphical (e.g., "point-and-click" or "touch gesture") fashion. These inputs, in turn, may be acted upon by the system 900 in accordance with instructions from operating system 910 and/or application(s) 902. The GUI 915 also serves to display the results of operation from the OS 910 and application(s) 902, whereupon the user may supply additional inputs or terminate the session (e.g., log off).

OS 910 can execute directly on the bare hardware 920 (e.g., processor(s) 804) of system 900. Alternatively, a hypervisor or virtual machine monitor (VMM) 930 may be interposed between the bare hardware 920 and the OS 910. In this configuration, VMM 930 acts as a software "cushion" or virtualization layer between the OS 910 and the bare hardware 920 of the system 800.

VMM 930 instantiates and runs one or more virtual machine instances ("guest machines"). Each guest machine comprises a "guest" operating system, such as OS 910, and one or more applications, such as application(s) 902, designed to execute on the guest operating system. The VMM 930 presents the guest operating systems with a virtual operating platform and manages the execution of the guest operating systems.

In some instances, the VMM 930 may allow a guest operating system to run as if it is running on the bare hardware 920 of system 800 directly. In these instances, the same version of the guest operating system configured to execute on the bare hardware 920 directly may also execute on VMM 930 without modification or reconfiguration. In other words, VMM 930 may provide full hardware and CPU virtualization to a guest operating system in some instances.

In other instances, a guest operating system may be specially designed or configured to execute on VMM 930 for efficiency. In these instances, the guest operating system is "aware" that it executes on a virtual machine monitor. In other words, VMM 930 may provide para-virtualization to a guest operating system in some instances.

The above-described basic computer hardware and software is presented for purpose of illustrating the basic underlying computer components that may be employed for implementing the example embodiment(s). The example embodiment(s), however, are not necessarily limited to any particular computing environment or computing device configuration. Instead, the example embodiment(s) may be implemented in any type of system architecture or processing environment that one skilled in the art, in light of this disclosure, would understand as capable of supporting the features and functions of the example embodiment(s) presented herein.

EXTENSIONS AND ALTERNATIVES

In the foregoing specification, embodiments of the disclosure have been described with reference to numerous specific details that may vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction.

What is claimed is:

1. A method for multiplying a row of a first sparse matrix with a second sparse matrix to generate a row of a product matrix, the method comprising:
storing, in main memory, a compressed representation of said second sparse matrix, said compressed representation comprising a values array that stores one or more non-zero values of said second sparse matrix;
loading, into scratchpad memory, one or more tiles, each tile of said one or more tiles corresponding to a respective row of said second sparse matrix, said each tile of said one or more tiles comprising a respective set of one or more non-zero values of said values array;
generating, in said scratchpad memory, a particular partition of an uncompressed representation of said row of said product matrix, said particular partition corresponding to a partition of said second sparse matrix comprising one or more non-zero values included in said one or more tiles;
wherein generating, in said scratchpad memory, said particular partition of said uncompressed representation of said row of said product matrix comprises:
determining that a particular tile comprising one or more non-zero values of said partition is required to generate said particular partition;
loading into said scratchpad memory said particular tile,
wherein the method is performed by one or more computing devices.

2. The method of claim 1, wherein determining that said particular tile is required to generate said particular partition comprises performing a linear search for a partition boundary.

3. The method of claim 1, wherein determining that said particular tile is required to generate said particular partition comprises performing a binary search for a partition boundary.

4. The method of claim 1, wherein a tile of said one or more tiles comprises a number of non-zero values, said number varying according to a number of non-zero values included in said row of said first sparse matrix.

5. The method of claim 1, wherein said particular partition comprises a number of values, said number varying according to a number of non-zero values included in said row of said first sparse matrix.

6. The method of claim 1, wherein generating, in said scratchpad memory, said particular partition of said uncompressed representation of said row of said product matrix further comprises:
computing a respective set of one or more partial sums for each partition of said uncompressed representation of said row of said product matrix;
storing, in said main memory, said each partition of said uncompressed representation of said row of said product matrix;
retrieving, into said scratchpad memory, said particular partition along with one or more other tiles;
computing one or more other partial sums for said particular partition based on said one or more other tiles.

7. The method of claim 1, wherein a tile of said one or more tiles comprises a number of non-zero values that maximizes memory bandwidth.

8. The method of claim 1, wherein said first sparse matrix has multiple rows.

9. The method of claim 1, further comprising:
storing, in said main memory, said particular partition of said uncompressed representation of said row of said product matrix.

10. The method of claim 1, further comprising:
storing, in said main memory, a compressed representation of said product matrix.

11. One or more non-transitory storage media storing one or more sequences of instructions which, when executed by one or more computing devices, cause performance of a method for multiplying a row of a first sparse matrix with a second sparse matrix to generate a row of a product matrix, the method comprising:
storing, in main memory, a compressed representation of said second sparse matrix, said compressed representation comprising a values array that stores one or more non-zero values of said second sparse matrix;
loading, into scratchpad memory, one or more tiles, each tile of said one or more tiles corresponding to a respective row of said second sparse matrix, said each tile of said one or more tiles comprising a respective set of one or more non-zero values of said values array;
generating, in said scratchpad memory, a particular partition of an uncompressed representation of said row of said product matrix, said particular partition corresponding to a partition of said second sparse matrix comprising one or more non-zero values included in said one or more tiles;
wherein generating, in said scratchpad memory, said particular partition of said uncompressed representation of said row of said product matrix comprises:
determining that a particular tile comprising one or more non-zero values of said partition is required to generate said particular partition;
loading into said scratchpad memory said particular tile.

12. The one or more non-transitory storage media of claim 11, wherein determining that said particular tile is required to generate said particular partition comprises performing a linear search for a partition boundary.

13. The one or more non-transitory storage media of claim 11, wherein determining that said particular tile is required to generate said particular partition comprises performing a binary search for a partition boundary.

14. The one or more non-transitory storage media of claim 11, wherein a tile of said one or more tiles comprises a number of non-zero values, said number varying according to a number of non-zero values included in said row of said first sparse matrix.

15. The one or more non-transitory storage media of claim 11, wherein said particular partition comprises a number of values, said number varying according to a number of non-zero values included in said row of said first sparse matrix.

16. The one or more non-transitory storage media of claim 11, wherein generating, in said scratchpad memory, said particular partition of said uncompressed representation of said row of said product matrix further comprises:
- computing a respective set of one or more partial sums for each partition of said uncompressed representation of said row of said product matrix;
- storing, in said main memory, said each partition of said uncompressed representation of said row of said product matrix;
- retrieving, into said scratchpad memory, said particular partition along with one or more other tiles;
- computing one or more other partial sums for said particular partition based on said one or more other tiles.

17. The one or more non-transitory storage media of claim 11, wherein a tile of said one or more tiles comprises a number of non-zero values that maximizes memory bandwidth.

18. The one or more non-transitory storage media of claim 11, wherein said first sparse matrix has multiple rows.

19. The one or more non-transitory storage media of claim 11, wherein said one or more sequences of instructions further comprise instructions which, when executed by said one or more computing devices, cause:
- storing, in said main memory, said particular partition of said uncompressed representation of said row of said product matrix.

20. The one or more non-transitory storage media of claim 11, wherein said one or more sequences of instructions further comprise instructions which, when executed by said one or more computing devices, cause:
- storing, in said main memory, a compressed representation of said product matrix.

* * * * *

UNITED STATES PATENT AND TRADEMARK OFFICE
CERTIFICATE OF CORRECTION

PATENT NO. : 10,452,744 B2  
APPLICATION NO. : 15/470377  
DATED : October 22, 2019  
INVENTOR(S) : Agrawal et al.

Page 1 of 1

It is certified that error appears in the above-identified patent and that said Letters Patent is hereby corrected as shown below:

On the Title Page

On page 2, Column 1, under Other Publications, Line 2, delete "muiltiplication" and insert -- multiplication --, therefor.

In the Specification

In Columns 11-12, Line 63, delete "non- zero" and insert -- non-zero --, therefor.

In Columns 11-12, Line 68, delete "non- zero" and insert -- non-zero --, therefor.

In Columns 11-12, Line 73, delete "/* p_columnsj(j)," and insert -- p_columns(j), --, therefor.

In Columns 11-12, Line 73, delete "title(p_size)" and insert -- tile(p_size) --, therefor.

In Columns 13-14, Line 11, delete "title_" and insert -- tile --, therefor.

In Columns 13-14, Line 12, below "search_physical" insert -- /* Generation Loop */ --.

In Columns 13-14, Line 33, delete "=fetch" and insert -- = fetch --, therefor.

In Columns 13-14, Line 36, delete "=+p_size" and insert -- =+ p_size --, therefor.

In Columns 13-14, Line 38, delete "=compress(rowC)" and insert -- = compress(rowC) --, therefor.

Signed and Sealed this  
Ninth Day of February, 2021

Drew Hirshfeld  
*Performing the Functions and Duties of the*  
*Under Secretary of Commerce for Intellectual Property and*  
*Director of the United States Patent and Trademark Office*